US007265628B2

(12) United States Patent
Lloyd et al.

(10) Patent No.: US 7,265,628 B2
(45) Date of Patent: Sep. 4, 2007

(54) MARGIN TRACKING CASCODE CURRENT MIRROR SYSTEM AND METHOD

(75) Inventors: Jennifer A. Lloyd, North Andover, MA (US); Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 158 days.

(21) Appl. No.: 11/224,760

(22) Filed: Sep. 13, 2005

(65) Prior Publication Data

US 2007/0057730 A1 Mar. 15, 2007

(51) Int. Cl.
*H03F 3/04* (2006.01)

(52) U.S. Cl. ....................................... 330/288; 323/315

(58) Field of Classification Search ................ 330/288, 330/296, 311, 285; 323/315, 316
See application file for complete search history.

(56) References Cited

U.S. PATENT DOCUMENTS 6,169,456 B1 * 1/2001 Pauls ......................... 330/288
6,646,481 B2 * 11/2003 Blankenship et al. ........ 327/109
6,809,590 B1 * 10/2004 Wong et al. ................ 330/265

* cited by examiner

*Primary Examiner*—Henry Choe
(74) *Attorney, Agent, or Firm*—Iandiorio & Teska

(57) ABSTRACT

A margin tracking cascode current mirror system including a current mirror circuit having a current source device having a predetermined operating voltage for providing a current to a load, a cascode circuit interconnected between the current mirror and the load for controlling the output impedance of the system and for establishing a current control voltage, a cascode bias circuit for providing a forward bias to the cascode circuit, and a compound cascode bias circuit for independently controlling the slope and the offset of the current control voltage to track the predetermined operating voltage with a predetermined margin.

30 Claims, 5 Drawing Sheets

MARGIN TRACKING CASCODE CURRENT MIRROR SYSTEM AND METHOD

FIELD OF THE INVENTION

This invention relates generally to cascode current mirror circuits and more particularly to a margin tracking cascode current mirror system.

BACKGROUND OF THE INVENTION

Current source devices are often used in high precision and high speed designs to drive virtually any type of electrical circuit. One such current source device is a current mirror circuit. The current mirror circuit includes a current source connected to a current reference device on the input leg. The output leg includes a current source device (e.g., a current source transistor) connected to a load circuit. A predetermined bias current ($I_{BIAS}$) is applied by the current source to the current reference device that is mirrored to the current source device. The goal of the current mirror circuit is to provide matched currents in the input and output legs to drive the load circuit with the predetermined bias current supplied by the current source.

The current source device has a voltage-current characteristic of $V_{DS}$ to $I_D$ that has a corresponding family of $V_{GS}$ curves when the voltage applied by the current reference device to the current source device exceeds the threshold voltage, $V_T$, plus a gate overdrive voltage. For a given $V_{GS}$ curve, the current source device will operate at a relatively constant current, $I_D$, when the $V_{DS}$ of the current source device is greater than its saturation voltage, $V_{DSAT}$. The amount that $V_{DS}$ is above $V_{DSAT}$ is known as the voltage margin. For the current reference device, the voltage margin is equal to the threshold voltage. However, because the load voltage imposed by the load circuit can vary, the $V_{DS}$ of the current source device will vary. The change in $V_{DS}$ of the current source device changes its output current. Hence, the current in the output leg will differ from the current of the input leg. Because the load circuit is often designed to operate with a particular current, or a particular range of currents, variations in the current in the output leg can cause the load circuit to malfunction.

Cascode devices are often used to overcome the problems associated with the mismatched currents in the input and output legs of the current mirror circuit. A typical conventional cascode current mirror circuit includes a current mirror circuit as described above with a cascode bias device on the input leg and a cascode device on the output leg. The cascode bias device forward biases the $V_{GS}$ of the cascode device. The cascode device establishes a current control voltage between the cascode device and the current source device that prevents the load voltage from significantly affecting the $V_{DS}$ of current source device. The result is that the currents in the input and output legs will be approximately equal.

However, because the threshold voltage, $V_T$, utilized by the current mirror circuit is very large, e.g., about 700 mV, the conventional cascode current mirror circuit generates an excessive voltage margin, which wastes valuable headroom. Moreover, as temperature varies, the current control voltage does not track the saturation voltage of the current source device. Hence, the cascode current mirror is constrained by the worst-case margin that occurs at higher temperatures.

A conventional improved cascode current mirror circuit attempts to overcome the problems associated with the excessive voltage margin generated when the threshold voltage is utilized to enable the current source device. The conventional improved cascode current mirror circuit relies on adding a third leg to the conventional cascode current mirror circuit which utilizes a cascode bias device to replicate the $V_{GS}$ of the cascode device and a second cascode bias device which attempts to replicate the $V_{DSAT}$ plus a reduced fixed margin of the current source device. The solution offered by the conventional improved cascode current mirror however is not fully satisfactory because it relies on adjusting both the offset and the slope of the current control voltage at the same time (e.g., one "control knob") in an attempt to track the current control voltage with the $V_{DSAT}$ of the current source device. Thus, one can not optimize the current control voltage with respect to each of the offset and the slope. If the current control voltage is optimized with respect to one the other is sacrificed and so a compromise adjustment must be settled on. The conventional improved cascode current mirror also does not accurately track the voltage margin of the current control voltage to the saturation voltage as temperature varies.

SUMMARY OF THE INVENTION

It is therefore an object of this invention to provide an improved margin tracking cascode current mirror system and method.

It is a further object of this invention to provide such a margin tracking cascode current mirror system and method which utilizes less headroom.

It is a further object of this invention to provide such a margin tracking cascode current mirror system and method which maintains a constant voltage margin over temperature and process variations.

It is a further object of this invention to provide such a margin tracking cascode current mirror system and method which operates over a wide range of temperatures.

This invention results from the realization that an improved voltage tracking cascode current mirror system and method can be achieved by utilizing an innovative compound cascode bias circuit that can independently control the slope and control the offset of the current control voltage and thus generate a current control voltage that accurately tracks the saturation voltage of the current source device with a constant voltage margin as temperature varies.

The subject invention, however, in other embodiments, need not achieve all these objectives and the claims hereof should not be limited to structures or methods capable of achieving these objectives.

This invention features a margin tracking cascode current mirror system including a current mirror circuit having a current source device having a predetermined operating voltage for providing a current to a load, a cascode circuit interconnected between the current mirror and the load for controlling the output impedance of the system and for establishing a control voltage, a cascode bias circuit for providing a forward bias to the cascode circuit, and a compound cascode bias circuit for independently controlling the slope and the offset of the control voltage to track the predetermined operating voltage with a predetermined voltage margin.

In one embodiment, the control voltage may include a current control voltage. The margin may include a voltage margin. The margin may include a transconductance margin. The predetermined operating voltage may be tracked with the predetermined margin with variations in temperature. The predetermined operating voltage may be tracked with the predetermined margin with variations in bias current.

The predetermined operating voltage may include the saturation voltage of the current source device. The compound cascode bias circuit may include first and second components. The first and second components may have different temperature and process varying intrinsic device parameters. The predetermined margin may include a constant margin. The one of the first and second components may include an active device and the other of the first and second components may include a passive device. The passive device may include an impedance. The passive device may include a resistor. The active device may include a bias voltage generator. The bias voltage generator may include an N-type device or a P-type device. The system may include a replica cascode device for maintaining the current control voltage of the reference leg of the cascode current mirror equal to the current control voltage. The system may drive a load circuit connected to cascode circuit. The current source device may include an amplifier circuit. The current source device may include a differential amplifier circuit. The current source device may include an N-type device or a P-type device. The cascode circuit may include a P-type device or an N-type device. The cascode bias circuit may include an N-type device or a P-type device.

This invention also features a method for margin tracking a cascode current mirror system, the method comprising providing a current to a load with a current mirror circuit including a current source device having a predetermined operating voltage, controlling the output impedance of the system and establishing a control voltage, and independently controlling the slope and offset of the control voltage to track predetermined operating voltage with a predetermined margin.

In one embodiment, the control voltage may include a current control voltage. The margin may include a voltage margin. The margin may include a current margin. The predetermined voltage margin includes the saturation voltage of the current source device.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
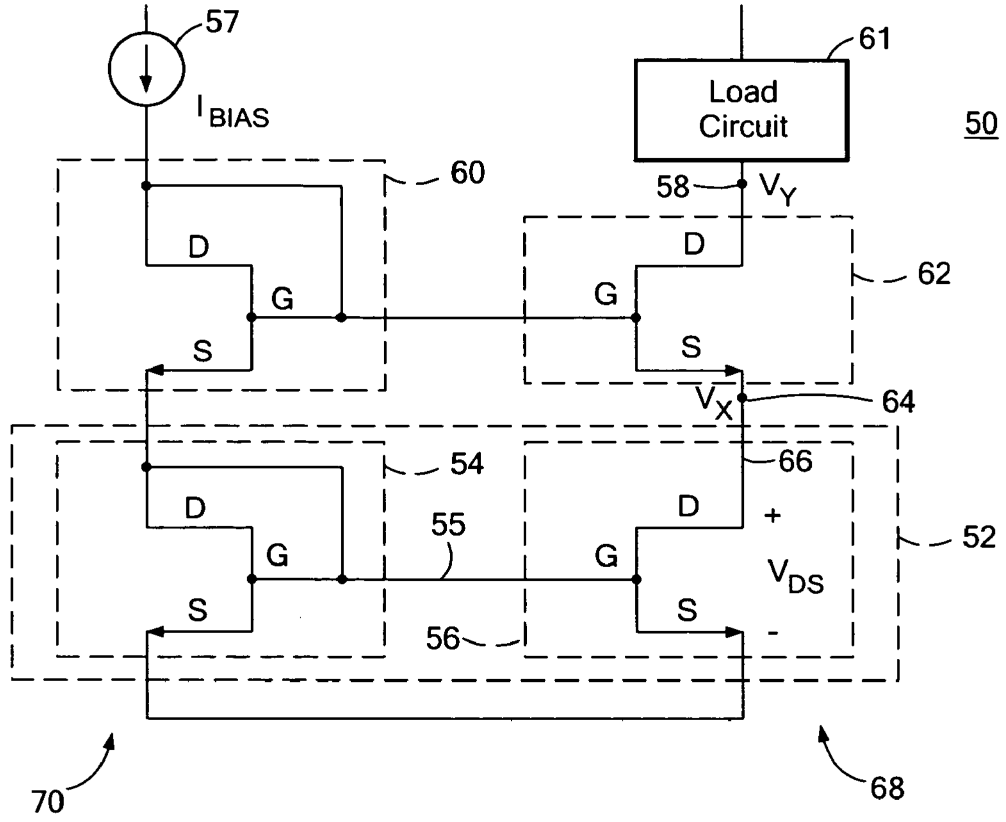
FIG. 1 (PRIOR ART)
FIG. 1 is a schematic block diagram of a prior art cascode current mirror circuit.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

To overcome the problems associated with mismatched currents of a conventional current mirror circuit, conventional cascode current mirror circuit 50, FIG. 1 includes current mirror circuit 52 with current reference device 54 and current source device 56. To overcome the problems associated with the load voltage, $V_Y$, indicated at 58, varying due to load circuit 61, cascode current mirror circuit 50 includes cascode bias device 60 which forward biases the $V_{GS}$ of cascode device 62. Cascode device 62 develops a current control voltage, $V_X$, at node 64 that eliminates the problems associated with variations due to load circuit 61 affecting the $V_{DS}$ of current source device 56. Current reference device 54 applies a threshold voltage, $V_T$, plus a gate overdrive voltage to enable current source device 56 to conduct current, $i_D$, on line 66. Because the $V_{DS}$ of current source device 56 is no longer affected by load circuit 61, the current, $I_{BIAS}$, supplied by current source 57 to input leg 70 of cascode device 50 is approximately equal to the current in output leg 68.

However, as discussed above, the current mirror of conventional cascode current mirror 50 relies on utilizing the threshold voltage, $V_T$, (plus a small gate overdrive voltage) to enable current source device 56 and ensure that current source device 56 is operating in the constant current region above $V_{DSAT}$. Because $V_T$ is very large, cascode current mirror 50 generates an excessive voltage margin that wastes valuable headroom.

Figure 2:
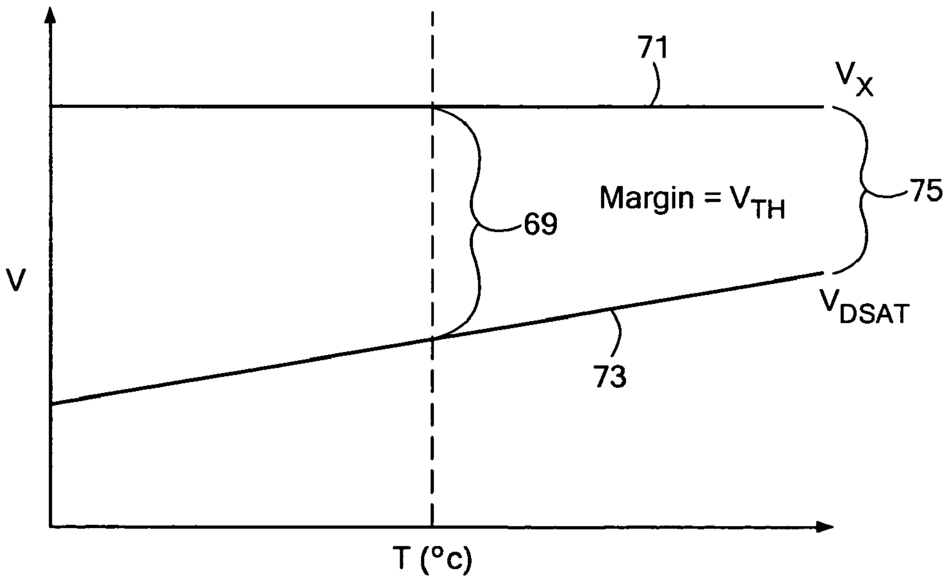
FIG. 2 (PRIOR ART)
FIG. 2 is a graph showing the inaccurate tracking of the voltage margin between the current control voltage and the saturation voltage of the prior art cascode current mirror shown in FIG. 1.

Moreover, as shown in FIG. 2, cascode current mirror 50 does not maintain a constant voltage margin, indicated at 69, between the current control voltage, $V_X$, 71 and the saturation voltage 73 of current source device 56, as temperature varies. Hence, cascode current mirror 50 is headroom constrained by the worst-case voltage margin, e.g., the voltage margin indicated at 75.

Figure 3:
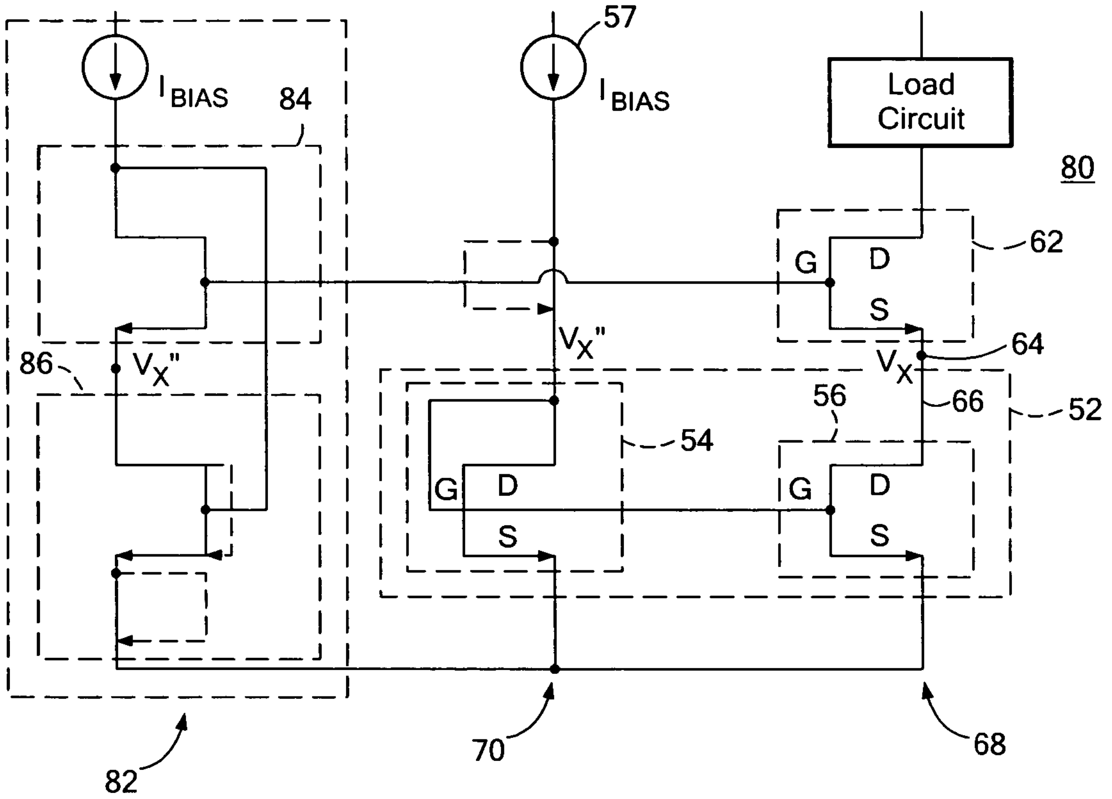
FIG. 3 (PRIOR ART)
FIG. 3 is a schematic block diagram of an improved prior art cascode current mirror.
Figure 4:
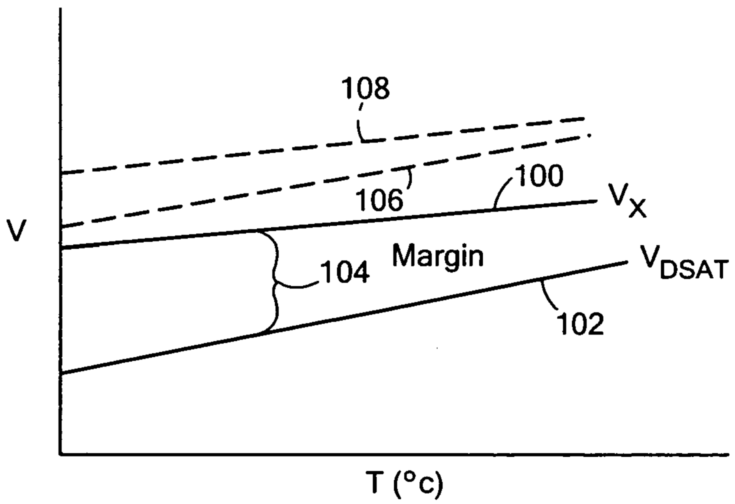
FIG. 4 (PRIOR ART)
FIG. 4 is a graph showing the inaccurate tracking of the voltage margin between the current control voltage and the saturation voltage of the improved prior art cascode current mirror shown in FIG. 3.

Improved cascode current mirror 80, FIG. 3, where like parts have been given like numbers, includes third leg 82 that has a first cascode bias device 84 that replicates the $V_{GS}$ of cascode device 62 and a second cascode device 86 which attempts to replicate $V_{DSAT}$ plus a reduced fixed margin of current source device 56 to eliminate the problems associated with utilizing a threshold voltage, $V_T$, to enable current source device 56. Although improved cascode current mirror circuit 80 no longer relies on the threshold voltage, it also does not accurately track the voltage margin between the current control voltage, $V_X$, indicated at 64 and the saturation voltage of current source device 56 as temperature varies. For example, as shown in FIG. 4, the voltage margin, 104 between the current control voltage 100 and the saturation voltage 102 of current source device 56 is not accurately tracked as the temperature increases. Moreover, improved cascode current mirror circuit 80 relies on adjusting both the amount of voltage margin (offset) and slope of the current control voltage at the same time (e.g., with one control "knob") to generate the current control voltage curve 100. For example, improved cascode current mirror 80, FIG. 4, generates current control voltage curve 106 that is generated by adjusting one set of slope and voltage margin (offset) characteristics. Similarly, current control voltage curve 102 is generated by adjusting a different set of voltage margin (offset) and slope characteristics. Therefore adjusting one of the slope and margin necessarily adjusts the other and so it is difficult to optimize both.

Figure 5:
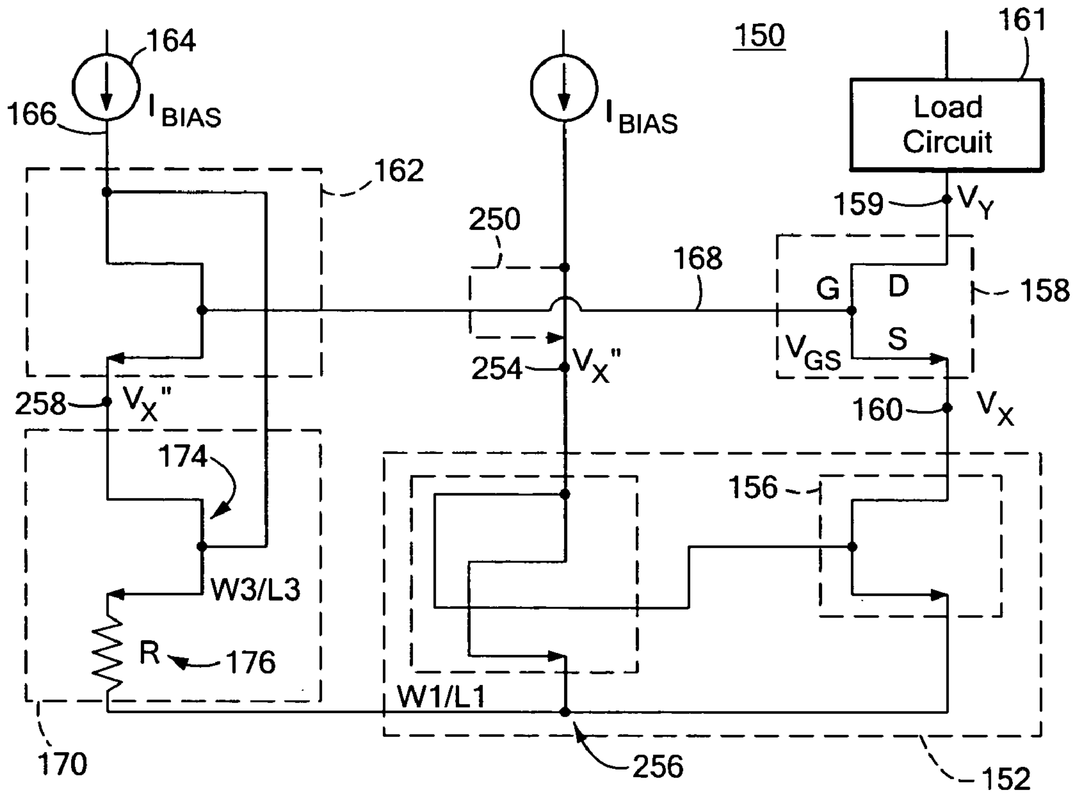
FIG. 5 is a schematic diagram of the margin tracking cascode current mirror system of this invention.

In contrast, margin tracking cascode current mirror system 150, FIG. 5, of this invention includes current mirror circuit 152 including current source device 156 having a predetermined operating voltage, e.g., saturation voltage, $V_{DSAT}$, for providing current to load circuit 161. System 150 also includes cascode circuit 158 interconnected between current mirror 152 and load circuit 161 for controlling the output impedance of system 150 and establishing a control voltage, e.g., current control voltage $V_X$, at node 160. Cascode bias circuit 162 is responsive to current supply 164 on line 166 and provides a bias voltage on line 168 to forward bias (enable) the $V_{GS}$ of cascode circuit 158. Similarly as described above, the control voltage developed at node 160 prevents the load voltage, $V_Y$ 159 of load circuit 161 from affecting the $V_{DS}$ of current source device 156. Typically, current source device 156, cascode circuit 158 and cascode bias circuit 162 are N-type devices (e.g., a JFET or BJT transistor), but this is not a necessary limitation of this invention, as P-type devices may also be utilized.

Figure 6A:
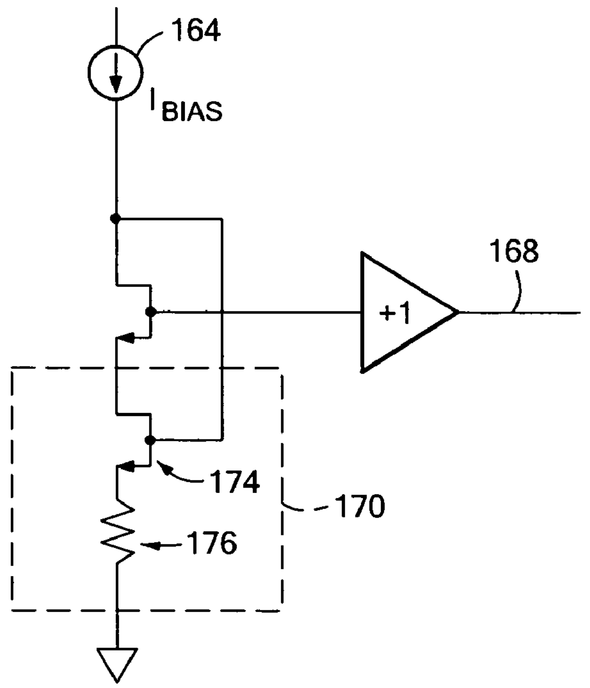
FIGS. 6A-6D are circuit diagrams of various embodiments of the compound cascode bias circuit shown in FIG. 5.
Figure 6B:
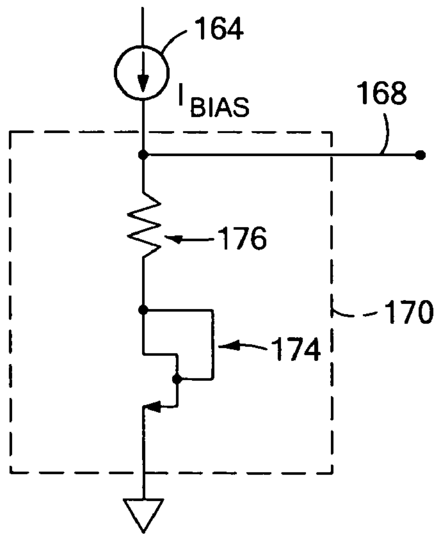
Figure 6C:
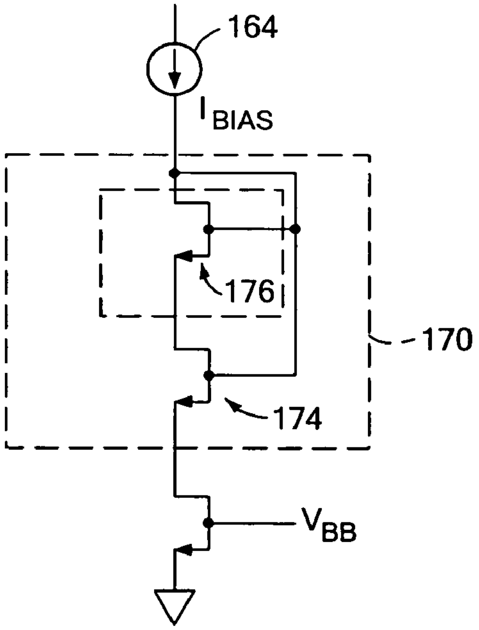
Figure 6D:
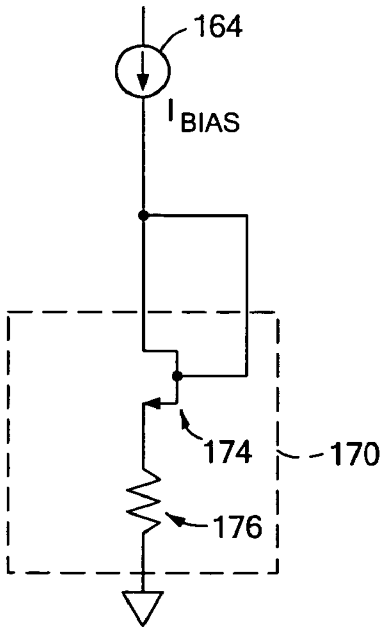

Compound cascode bias circuit 170 independently controls the slope and offset of the current control voltage, $V_X$ at node 160 to track the predetermined operating voltage, e.g., the saturation voltage, $V_{DSAT}$, of current source device 156 with a predetermined, e.g., constant, margin, such as a voltage margin or transconductance margin. Hence, compound cascode bias circuit 170 effectively provides two "control knobs" for adjusting the current control voltage: one for adjusting the slope and the other for adjusting the offset of the current control voltage. Compound cascode bias circuit 170 typically includes first component 174 and second component 176. First component 174 is typically an active device, e.g., a bias generator, such as an N-type JFET or BJT transistor (although P-type devices may be utilized) that generates the slope of the current control voltage, $V_X$ 160. Component 176, FIG. 5 is typically a passive device, e.g., a resistor, that generates the offset of the control voltage, $V_X$ 160. Compound cascode bias circuit 170 may also be a diode connected device. In one design, compound cascode bias circuit 170 may be buffered as shown in FIG. 6A. In one embodiment, compound cascode bias circuit 170 includes first component 174 connected to second component 176 as shown in FIG. 5. In other designs, compound cascode bias circuit 170 includes first component 174 connected to second component 176 as shown in FIG. 6B, e.g., first component 174 is swapped with second component 176. Compound cascode bias circuit 170, FIG. 6C may also include first component 174 and second component 176 that are both active devices. Although as shown in FIG. 5 compound cascode bias circuit 170 includes first component 174 and second component 176 connected to cascode bias circuit 162, this is not a necessary limitation of this invention, as compound cascode bias circuit 170, FIG. 6D, may include as first component 174 connected to current supply 164.

Typically, first component 174 and second component 176 have different temperature and process varying intrinsic properties, such as temperature, width, length, current, and the like.

Figure 7:
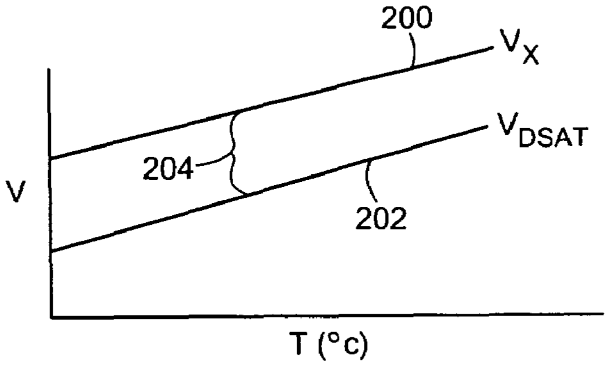
FIG. 7 is a graph showing the current control voltage accurately tracking the saturation voltage for the margin tracking cascode current mirror system shown in FIG. 5.

The result is that margin tracking cascode current mirror system 150 of this invention generates a control voltage, $V_X$, at node 160 which accurately tracks the predetermined operating voltage, e.g., saturation voltage $V_{DSAT}$, of current source device 156 with variations in temperature by independently changing both the slope and the offset of the current control voltage. For example, as shown in FIG. 7, the control voltage, $V_X$, generated by system 150 is shown by curve 200 and the saturation voltage of current source device 156 is shown by curve 202. The voltage margin, indicated at 204, between current control voltage curve 200 and the saturation voltage ($V_{DSAT}$) curve 202 of the current source device is accurately tracked with variations in temperature.

Figure 8:
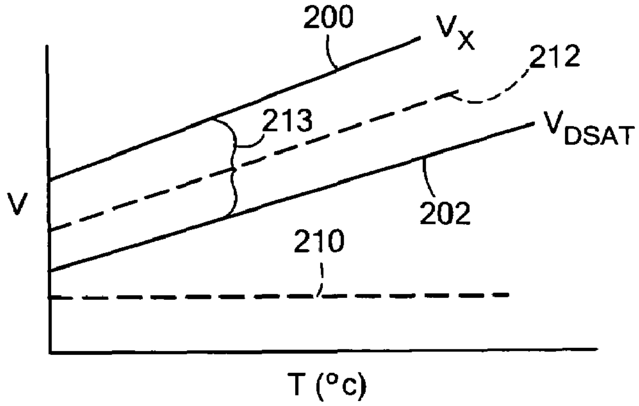
FIG. 8 is a graph showing another example of the margin tracking cascode current mirror system shown in FIG. 5 independently controlling the slope and offset of the current control voltage.

Moreover, as discussed above, compound cascode bias circuit 170, FIG. 5 can utilize the two control knobs to independently control the slope and offset of the current control voltage. For example, as shown in FIG. 8, passive device 176 (e.g., a resistor) of compound cascode bias circuit 170 can act as one control knob to generate the offset, indicated by curve 210, for the current control voltage. Active device 174, e.g., a bias generator, of compound cascode bias circuit 170 can act as another control knob to generate the slope of the current control voltage, as shown by curve 212. When offset curve 210 is added to slope curve 212, the result is current control voltage curve 200. As can be seen, current control voltage curve 200 accurately tracks the saturation voltage curve 202 with a constant margin, indicated at 213, as temperature varies.

Figure 9:
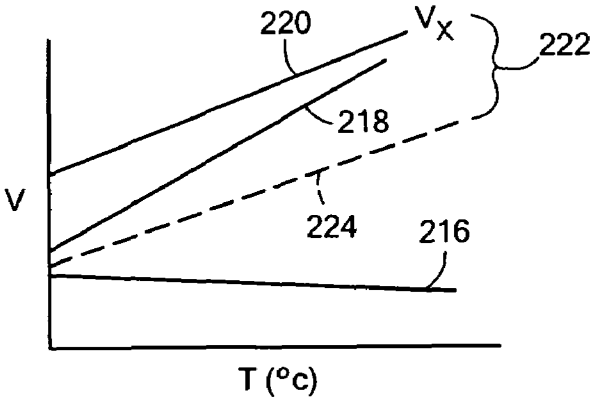
FIG. 9 is a graph showing yet another example of the margin tracking cascode current mirror system shown in FIG. 5 independently controlling the slope and offset of the current control voltage.

FIG. 9 shows another example of system 150 independently controlling both the slope and offset of current control voltage as temperature varies. In this example, compound cascode bias circuit 170 generates two separate slope and offset curves that are added together to generate the desired control voltage curve. Specifically, compound cascode bias circuit 170 generates a first slope and offset curve 216 and a second slope and offset curve 218. Slope and offset curves 216 and 218 are then added together to generate current control voltage curve 220. The result is that current control voltage curve 220 accurately tracks the saturation voltage, $V_{DSAT}$, of the current source device, shown by curve 224, with a constant margin, indicated at 222, as temperature varies.

Although as described above, the control voltage is tracked to the predetermined operating voltage with a predetermined margin, e.g., voltage margin or transconductance margin with variations in temperature, this is not a necessary limitation of this invention as the control voltage may be tracked to the predetermined operating voltage with a predetermined margin, e.g., voltage margin or transconductance margin with variations in bias current.

In one design, margin tracking cascode current mirror system 150, FIG. 5, may include replica cascode device 250, shown in phantom, for maintaining current control voltage $V_X'$ at node 252 in reference leg 256. Cascode bias circuit 162 and compound cascode bias circuit 170 also establish a current control voltage, $V_X''$ which equals current control voltage, $V_X$, at node 160.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A margin tracking cascode current mirror system comprising:

a current mirror circuit including a current source device having a predetermined operating voltage for providing a current to a load;

a cascode circuit interconnected between said current mirror and the load for controlling the output impedance of the system and for establishing a control voltage;

a cascode bias circuit for providing a forward bias to said cascode circuit; and a compound cascode bias circuit for independently controlling the slope and the offset of the control voltage to track the predetermined operating voltage with a predetermined margin.

2. The system of claim 1 in which the control voltage includes a current control voltage.

3. The system of claim 1 in which the margin includes a voltage margin.

4. The system of claim 1 in which the margin includes a transconductance margin.

5. The system of claim 1 in which said predetermined operating voltage is tracked with said predetermined margin with variations in temperature.

6. The system of claim 1 in which said predetermined operating voltage is tracked with said predetermined margin with variations in bias current.

7. The system of claim 1 in which said predetermined operating voltage includes the saturation voltage of said current source device.

8. The system of claim 1 in which said compound cascode bias circuit includes first and second components.

9. The system of claim 6 in which said first and second components have different temperature and process varying intrinsic device parameters.

10. The system of claim 1 in which said predetermined voltage margin includes a constant margin.

11. The system of claim 5 in which one of said first and second components includes an active device and the other of said first and second components includes a passive device.

12. The system of claim 9 in which said passive device includes a resistor.

13. The system of claim 9 in which said active device includes a bias voltage generator.

14. The system of claim 13 in which said bias voltage generator includes an N-type device.

15. The system of claim 13 in which said bias voltage generator includes a P-type device.

16. The system of claim 1 further including a replica cascode device for maintaining said current control voltage of the reference leg of said cascode current mirror equal to said current control voltage.

17. The system of claim 1 in which said system drives a load circuit connected to cascode circuit.

18. The system of claim 1 in which said current source device includes an amplifier circuit.

19. The system of claim 1 in which said current source device includes a differential amplifier circuit.

20. The system of claim 1 in which said current source device includes an N-type device.

21. The system of claim 1 in which said current source device includes a P-type device.

22. The system of claim 1 in which said cascode circuit includes a P-type device.

23. The system of claim 1 in which said cascode circuit includes an N-type device.

24. The system of claim 1 in which said cascode bias circuit includes an N-type device.

25. The system of claim 1 in which said cascode bias circuit includes a P-type device.

26. A method for margin tracking a cascode current mirror system, the method comprising:

providing a current to a load with a current mirror circuit including a current source device having a predetermined operating voltage;

controlling the output impedance of the system and establishing a control voltage; and independently controlling the slope and offset of said control voltage to track said predetermined operating voltage with a predetermined margin.

27. The method of claim 26 in which said control voltage includes a current control voltage.

28. The method of claim 26 in which said predetermined operating voltage includes the saturation voltage of said current source device.

29. The method of claim 26 in which said margin includes a voltage margin.

30. The method of claim 26 in which said margin includes a current margin.

* * * * *